United States Patent
Kim

(10) Patent No.: US 7,068,037 B2
(45) Date of Patent: Jun. 27, 2006

(54) METHOD OF DIAGNOSING INVERTER TROUBLE

(75) Inventor: Min-Keuk Kim, Seoul (KR)

(73) Assignee: LG Industrial Systems Co., Ltd., Seoul (KR)

( * ) Notice: Subject to any disclaimer, the term of this patent is extended or adjusted under 35 U.S.C. 154(b) by 122 days.

(21) Appl. No.: 10/795,379

(22) Filed: Mar. 9, 2004

(65) Prior Publication Data

US 2004/0189316 A1    Sep. 30, 2004

(30) Foreign Application Priority Data

Mar. 26, 2003  (KR) .................... 10-2003-0018897

(51) Int. Cl.
*G01R 31/14*   (2006.01)
(52) U.S. Cl. .................... 324/508; 324/510
(58) Field of Classification Search ............ 324/508
See application file for complete search history.

(56) References Cited

U.S. PATENT DOCUMENTS 5,214,575 A * 5/1993 Sugishima et al. ........... 361/42
5,309,349 A * 5/1994 Kwan ........................... 363/17
5,483,167 A * 1/1996 Mikami ....................... 324/510
5,686,839 A * 11/1997 Takagi ......................... 324/510
5,945,802 A * 8/1999 Konrad et al. ................ 361/42

\* cited by examiner

*Primary Examiner*—Anjan Deb
*Assistant Examiner*—Timothy J. Dole
(74) *Attorney, Agent, or Firm*—Greenblum & Bernstein, P.L.C.

(57) ABSTRACT

Disclosed is a method of diagnosing inverter trouble capable of improving convenience of use and safety of the user by notifying the user of the error of switching devices used for outputting AC voltage of the inverter and the earth fault of an output of the inverter when applying power to the inverter. The method includes the steps of determining whether or not each of switching devices has a fault by sequentially switching on the switching devices when an inverter is initialize by receiving power, recording sorts and fault states of the switching devices having the fault, detecting whether or not an earth fault occurs by outputting each phase voltage of the inverter, recording phases having the earth fault and an earth fault state thereof, determining the inverter trouble with reference to a fault record of the switching devices and an earth fault record, and waiting for a normal operation if the inverter has no trouble, and waiting for an order of a user if the inverter trouble occurs while displaying the inverter trouble.

14 Claims, 4 Drawing Sheets

| U Drive driving | / V Drive driving | 1) U-V same current | 1) and 3) occur | Normal |
|---|---|---|---|---|
| | | 2) U-V different current | 1) and 4) occur | W-Phase fault |
| | / W Drive driving | 3) U-W same current | 2) and 3) occur | V-Phase fault |
| | | 4) U-W different current | 2) and 4) occur | U-Phase fault |
| V Drive driving | / U Drive driving | 5) V-U same current | 5) and 7) occur | Normal |
| | | 6) V-U different current | 5) and 8) occur | W-Phase fault |
| | / W Drive driving | 7) V-W same current | 6) and 7) occur | U-Phase fault |
| | | 8) V-W different current | 6) and 8) occur | V-Phase fault |
| W Drive driving | / U Drive driving | 9) W-U same current | 9) and 11) occur | Normal |
| | | 10) W-U different current | 9) and 12) occur | V-Phase fault |
| | / V Drive driving | 11) W-V same current | 10) and 11) occur | U-Phase fault |
| | | 12) W-V different current | 10) and 12) occur | W-Phase fault |

FIG. 4

| U Drive driving | / V Drive driving | 1) U-V same current | 1) and 3) occur | Normal |
|---|---|---|---|---|
| | | 2) U-V different current | 1) and 4) occur | W-Phase fault |
| | / W Drive driving | 3) U-W same current | 2) and 3) occur | V-Phase fault |
| | | 4) U-W different current | 2) and 4) occur | U-Phase fault |
| V Drive driving | / U Drive driving | 5) V-U same current | 5) and 7) occur | Normal |
| | | 6) V-U different current | 5) and 8) occur | W-Phase fault |
| | / W Drive driving | 7) V-W same current | 6) and 7) occur | U-Phase fault |
| | | 8) V-W different current | 6) and 8) occur | V-Phase fault |
| W Drive driving | / U Drive driving | 9) W-U same current | 9) and 11) occur | Normal |
| | | 10) W-U different current | 9) and 12) occur | V-Phase fault |
| | / V Drive driving | 11) W-V same current | 10) and 11) occur | U-Phase fault |
| | | 12) W-V different current | 10) and 12) occur | W-Phase fault |

METHOD OF DIAGNOSING INVERTER TROUBLE

BACKGROUND OF THE INVENTION

1. Field of the Invention

The present invention relates to a method of diagnosing inverter trouble, more particularly to a method of diagnosing inverter trouble, which can improve convenience in use and safety of a user by detecting and notifying the user of an error of a switching device used for outputting AC voltage of an inverter and an earth fault of an output of the inverter when applying power to the inverter.

2. Description of the Prior Art

As generally known in the art, an inverter has a fault protective function, so an error of the inverter is instantly displayed if malfunction of the inverter has been detected in response to an operating signal applied to the inverter after power is applied to the inverter.

FIG. 1 is a block view showing a structure of a conventional 3-phase switch used for outputting AC voltage of an inverter. The conventional 3-phase switch includes positive and negative voltage lines 11 and 12 for supplying DC voltage 13 to the inverter, U and U/drives 14 and 15 for driving U-phase positive and negative switching devices of the inverter, V and V/drives 16 and 17 for driving V-phase positive and negative switching devices of the inverter, W and W/drives 18 and 19 for driving W-phase positive and negative switching devices of the inverter, an earth fault detecting section 20 for outputting a fault signal by detecting an earth fault from U-phase, V-phase and W-phase outputs, and an over current detecting section 21 for protecting switching devices from over current and an error.

Hereinafter, a conventional method for managing the conventional inverter having an AC output section as described above will be explained with reference to FIG. 2.

FIG. 2 is a flow chart showing a conventional method for managing the conventional inverter. As shown in FIG. 2, the conventional method includes the steps of applying power to the inverter (S101), initializing operating conditions of the inverter for managing the inverter and waiting for a normal operation (S102), receiving an inverter operating order from a user (S103), detecting a fault of the inverter while operating the inverter (S104), and notifying the user of the fault of the inverter while stopping the operation of the inverter if the fault is detected during the operation of the inverter (S105).

According to the conventional inverter managing method, when the user applies power to the inverter, various operating conditions of the inverter are initialized. After the initializing step, the inverter waits for a normal operation.

Then, the user inputs the operating order into the inverter so that the inverter is operated according to the operating order of the user. If the user does not input the operating order, the inverter continuously waits for the operating order. That is, the inverter is operated in response to the operating order to the user and a fault inspection for the inverter begins simultaneously with the operation of the inverter.

Accordingly, the inverter is continuously operated if the fault does not occur in the inverter while the fault inspection is being continuously carried out. If the fault occurs in the inverter, the operation of the inverter stops and the fault is displayed.

However, according to the conventional method, any fault of components and any earth fault of the output of the inverter may be detected only when the user inputs the operating order into the inverter after power has been applied to the inverter, so a dependence rate for a protective circuit and risk of the user may increase. In addition, the fault can be detected only when the inverter is operated.

That is, the conventional inverter may display the fault according to a protective function of the inverter if the inverter represents the fault in response to the operating order of the user after power has been applied to the inverter. Accordingly, the user cannot recognize the fault if the fault occurs in the inverter before the operating order of the user has been inputted into the inverter in a state in which power has been applied to the inverter. Thus, the user is exposed to an accident if the fault of the inverter occurs in such circumstances.

SUMMARY OF THE INVENTION

Accordingly, the present invention has been made to solve the above-mentioned problems occurring in the prior art, and an object of the present invention is to provide a method of diagnosing an inverter trouble capable of improving convenience of use and safety of a user by notifying the user of an error of a switching device used for outputting AC voltage of an inverter and an earth fault of an output of the inverter when applying power to the inverter.

To accomplish the above object, the present invention provides a method for diagnosing an inverter trouble, the method comprising the steps of: determining whether or not each of switching devices has a fault by sequentially switching on the switching devices when an inverter is initialized by receiving power; recording sorts and fault states of the switching devices having the fault; detecting whether or not an earth fault occurs by outputting each phase voltage of the inverter; recording phases having the earth fault and an earth fault state thereof; determining the inverter trouble with reference to a fault record of the switching devices and an earth fault record; and waiting for a normal operation if the inverter has no trouble, and waiting for an order of a user if the inverter trouble occurs while displaying the inverter trouble.

BRIEF DESCRIPTION OF THE DRAWINGS

The above and other objects, features and advantages of the present invention will be more apparent from the following detailed description taken in conjunction with the accompanying drawings, in which:

FIG. 4 is a view for explaining a method of determining an earth fault in each phase according to one embodiment of the present invention.

DETAILED DESCRIPTION OF THE PREFERRED EMBODIMENT

Figure 1:
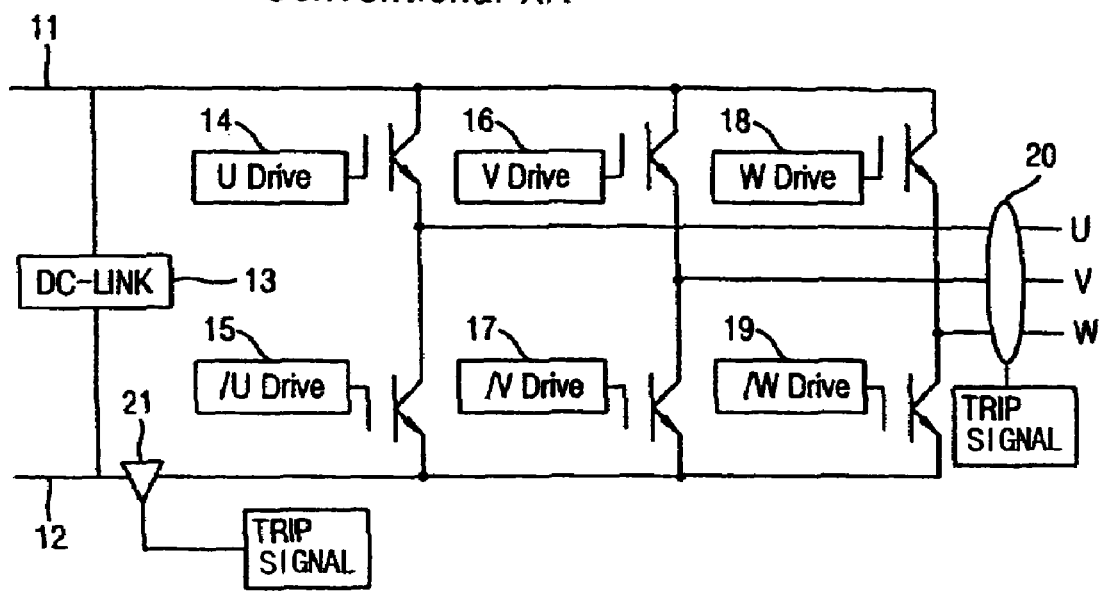
FIG. 1 is a block view showing a structure of a conventional 3-phase switch used for outputting AC voltage of an inverter.
Figure 2:
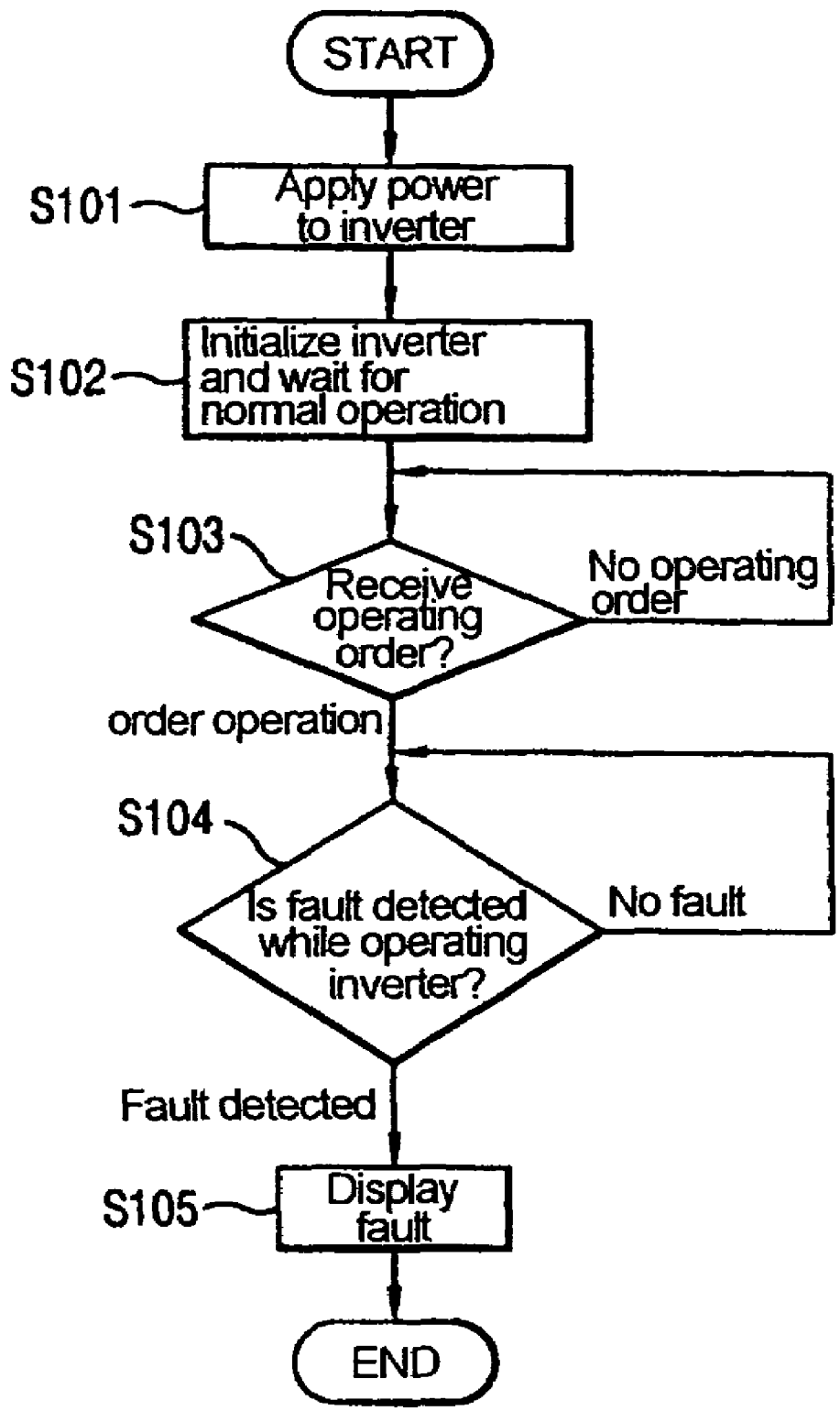
FIG. 2 is a flow chart showing a method for managing a conventional inverter.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
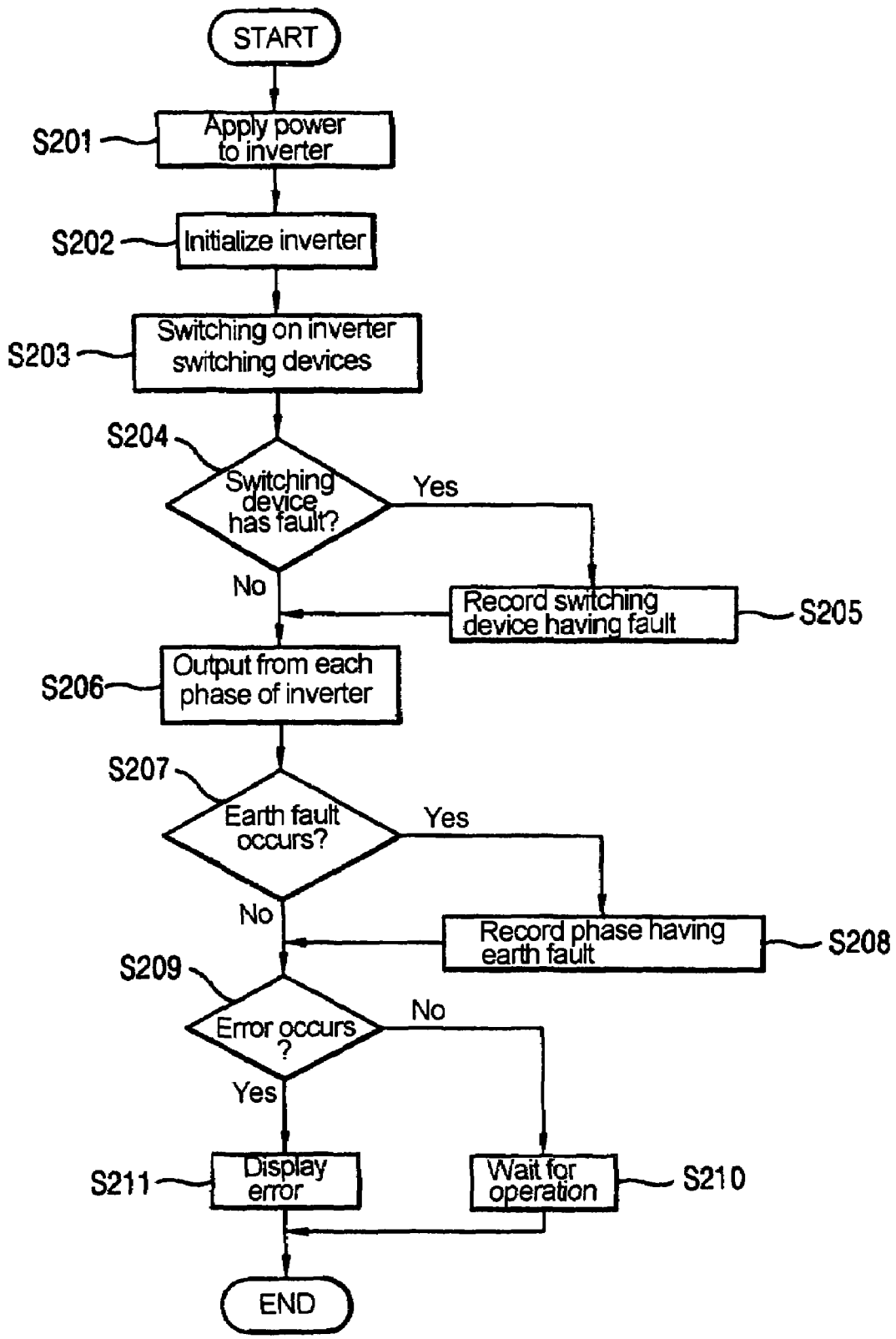
FIG. 3 is a flow chart showing a method of diagnosing inverter trouble according to one embodiment of the present invention.

FIG. 3 is a flow chart showing a method of diagnosing inverter trouble according to one embodiment of the present invention when power is applied to an inverter. As shown in FIG. 3, the method of diagnosing inverter trouble includes the steps of applying power to the inverter (S201), initializing the inverter when power is applied to the inverter (S202), sequentially switching on switching devices (referred to FIG. 1) one by one in order to diagnose inverter trouble (S203), determining a malfunction of the switching devices (S204), recording sorts and trouble states of the switching devices having a fault (S205), outputting voltage from each phase of the inverter if the switching device have no fault (S206), detecting an earth fault when phase voltage is outputted (S207), recording the phase having the earth fault and an earth fault state (S208), determining inverter trouble based on the fault of the switching devices and the earth fault (S209), waiting for a normal operation if inverter trouble does not occur (S210), and waiting for an order of a user if the inverter trouble occurs while displaying the inverter trouble (S211).

That is, according to the present invention, when the inverter is initialized by receiving power, switch drives, such as a U-drive 14, a V-drive 16 and a W-drive 18 (referred to FIG. 1), are driven for sequentially switching on corresponding switching devices in order to detect the fault of switching devices of the inverter used for outputting AC voltage.

If the switching devices have no fault, an over current detecting section 21 does not generate any signal. However, if at least one of the switching devices has the fault, a trip signal is generated from the over current detecting section 21.

For instance, if an over current signal is generated from the U-drive 14, it is determined that a U-phase negative switching device has the fault. If an over current signal is generated from the V-drive 16, it is determined that a V-phase negative switching device has the fault. In addition, if an over current signal is generated from the W-drive 18, it is determined that a W-phase negative switching device has the fault.

After that, switch drives, such as a /U-drive 15, a /V-drive 17 and a /W-drive 19 (shown in FIG. 1), are driven for sequentially turning on corresponding switching devices in order to detect whether of not the over current detecting section 21 generates the over current signal. If an over current signal is generated from the /U-drive 15, it is determined that a U-phase positive switching device has the fault. If an over current signal is generated from the /V-drive 17, it is determined that a V-phase positive switching device has the fault. In addition, if an over current signal is generated from the /W-drive 19, it is determined that a W-phase positive switching device has the fault.

When the fault is detected from the switching devices through the above method, the switching device having the fault and the fault states thereof are recorded and an earth fault detecting process is carried out. If the switching devices have no fault, a next diagnosing step is instantly carried out.

That is, the earth fault detecting process is carried out after detecting the fault of the switching devices. To this end, the U-drive 14 and the /V-drive 17 are simultaneously driven, thereby turning on corresponding switches. At this time, outputted current is detected and compared with U-phase and V-phase current. Then, the U-drive 14 and the /W-drive 19 are simultaneously driven, thereby turning on corresponding switches. At this time, outputted current is detected and compared with U-phase and W-phase current.

If detected current is different from both U-phase and V-phase current and U-phase and W-phase current, or if current is not detected, it is determined that a U-phase output is under an earth fault state. If detected current is different from one of U-phase and V-phase current and U-phase and W-phase current and is the same with the other of U-phase and V-phase current and U-phase and W-phase current, or if current is not detected, V-phase and W-phase outputs are under the earth fault state. In addition, if detected current is the same with U-phase and V-phase current and U-phase and W-phase current, it is determined that the inverter is normally operated.

With the same manner as described above, the switching devices are turned on in order to inspect the earth fault state of other phases of the inverter. A method for inspecting phases of the inverter is shown in FIG. 4 in detail.

Referring to FIG. 4, numeral 1) represents that U-phase current is identical to V-phase current, and numeral 2) represents that U-phase current is different from V-phase current when simultaneously driving the U-drive and the /V-drive. In addition, numeral 3) represents that U-phase current is identical to W-phase current, and numeral 4) represents that U-phase current is different from W-phase current when simultaneously driving the U-drive and the /W-drive. In this state, if output current is 1) and 3) state, it is determined that the inverter is a normal state. However, if output current is 1) and 4) states, it is determined that the W-phase of the inverter has a fault. In addition, if output current is 2) and 3) states, it is determined that the V-phase of the inverter has a fault, and if output current is 2) and 4) states, it is determined that the U-phase of the inverter has a fault.

The earth fault with respect to other phases of the inverter may be determined in the same manner as described above. That is, if V-phase current is identical to U-phase current, which are outputted by simultaneously driving the V-phase positive switching device and the U-phase negative switching device, and V-phase current is identical to W-phase current, which are outputted by simultaneously driving the V-phase positive switching device and the W-phase negative switching device, it is determined that the inverter is normally operated. In addition, if V-phase current is identical to U-phase current and is different from W-phase current, it is determined that the W-phase of the inverter has a fault. If V-phase current is different from U-phase current and is identical to W-phase current, it is determined that the U-phase of the inverter has a fault. In addition, if V-phase current is different from both U-phase current and W-phase current, it is determined that the V-phase of the inverter has a fault.

If W-phase current is identical to U-phase current, which are outputted by simultaneously driving the W-phase positive switching device and the U-phase negative switching device, and W-phase current is identical to V-phase current, which are outputted by simultaneously driving the W-phase positive switching device and the V-phase negative switching device, it is determined that the inverter is normally operated. In addition, if W-phase current is identical to U-phase current and is different from V-phase current, it is determined that the V-phase of the inverter has a fault. If W-phase current is different from U-phase current and is identical to V-phase current, it is determined that the U-phase of the inverter has a fault. In addition, if W-phase current is different from both U-phase current and V-phase current, it is determined that the W-phase of the inverter has a fault.

If the earth fault is detected through the earth fault inspection method as described above, the sorts of phases having the earth fault and earth fault states thereof are recorded. When the earth fault inspection has been completed with respect to all phases, error records or the earth fault records of the switching devices are inspected so as to determine whether or not the inverter has trouble. If there are no error records or the earth fault records of the switching devices, the inverter waits for the normal operation. If it is determined that the inverter has trouble, the inverter displays trouble and waits for the order of the user.

According to the present invention, inverter trouble is safely notified to the user by self-diagnosing the inverter trouble without causing a secondary loss of the inverter, thereby improving convenience of use and safety of the user.

As described above, the method of diagnosing inverter trouble according to the present invention can improve convenience of use and safety of the user by notifying the user of the error of switching devices used for outputting AC voltage of the inverter and the earth fault of an output of the inverter when applying power to the inverter.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for diagnosing inverter trouble, comprising:
   determining whether each of a plurality of switching devices has a fault by sequentially switching on the switching devices when an inverter is initialized by receiving power;
   determining that a second switching device has a fault if over current is detected due to driving of a first switching device;
   recording sorts and fault states of each of the plurality of switching devices having a fault;
   detecting whether an earth fault occurs by outputting each of a plurality of phase voltages of the inverter;
   recording phases having the earth fault and an earth fault state thereof;
   determining inverter trouble based on a fault record of the switching devices and an earth fault record; and
   waiting for a normal operation if the inverter has no trouble, and displaying inverter trouble and waiting for an order of a user if inverter trouble occurs.

2. The method according to claim 1, wherein the plurality of switching devices comprise a U-drive, a V-drive and a W-drive.

3. The method according to claim 1, wherein determining whether each of the plurality of switching devices has a fault comprises generating a trip signal by an over current detector.

4. The method according to claim 1, wherein the first switching device and the second switching device comprise switching devices for a same phase.

5. The method according to claim 1, wherein the first switching device comprises a negative switching device, and the second switching device comprises a positive switching device.

6. The method according to claim 1, wherein the first switching device comprises a positive switching device, and the second switching device comprises a negative switching device.

7. A method for diagnosing inverter trouble, comprising:
   determining whether each of a plurality of switching devices has a fault by sequentially switching on the switching devices when an inverter is initialized by receiving power;
   recording sorts and fault states of each of the plurality of switching devices having a fault;
   detecting whether an earth fault occurs by outputting each of a plurality of phase voltages of the inverter;
   recording phases having the earth fault and an earth fault state thereof;
   determining inverter trouble based on a fault record of the switching devices and an earth fault record; and
   waiting for a normal operation if the inverter has no trouble, and displaying inverter trouble and waiting for an order of a user if inverter trouble occurs, wherein detecting whether an earth fault occurs comprises:
   simultaneously driving a first-phase positive switching device and a second-phase negative switching device so as to detect first-phase current and second-phase current and to compare first-phase current with second-phase current;
   b) simultaneously driving the first-phase positive switching device and a third-phase negative switching device so as to detect first-phase current and third-phase current and to compare first-phase current with third-phase current;
   determining one of the second-phase negative switching device and the third-phase negative switching device as to have the earth fault, if a current value of one of the second-phase negative switching device and the third-phase negative switching device is different from a current value of the first-phase positive switching device; and
   d) determining the first-phase positive switching device as to have the earth fault, if current values of the second-phase negative switching device and the third-phase negative switching device are different from the current value of the first-phase positive switching device or if current is not detected.

8. The method according to claim 7, wherein the plurality of switching devices comprise a U-drive, a V-drive and a W-drive.

9. The method according to claim 7, wherein determining whether each of the plurality of switching devices has a fault comprises generating a trip signal by an over current detector.

10. The method according to claim 7, wherein the first-phase comprises a U-phase, the second-phase comprises a V-phase, and the third-phase comprises a W-phase.

11. A method for diagnosing inverter trouble, comprising:
    determining, in response to an inverter receiving power, whether each of a plurality of switching devices has a fault by sequentially switching on the switching devices when an inverter is initialized by receiving power;
    recording whether a fault occurs for each of the plurality of switching devices;
    detecting whether an earth fault occurs by outputting each of a plurality of phase voltages of the inverter;
    recording phases having an earth fault;
    determining inverter trouble based on a fault record of the plurality of switching devices and an earth fault record;
    waiting for a normal operation if the inverter has no trouble; and
    displaying inverter trouble and waiting for an order of a user if inverter trouble occurs.

12. The method according to claim 11, wherein the plurality of switching devices comprise a U-drive, a V-drive and a W-drive.

13. The method according to claim 11, wherein determining whether each of the plurality of switching devices has a fault comprises generating a trip signal by an over current detector.

14. The method according to claim 11, wherein the plurality of switching devices comprise positive switching devices and negative switching devices.

* * * * *

UNITED STATES PATENT AND TRADEMARK OFFICE
CERTIFICATE OF CORRECTION

PATENT NO. : 7,068,037 B2
APPLICATION NO. : 10/795379
DATED : June 27, 2006
INVENTOR(S) : M. Kim It is certified that error appears in the above-identified patent and that said Letters Patent is hereby corrected as shown below:

On the Title Page Item (57), Abstract, line 10, "initialize" should be --initialized--.

Signed and Sealed this

Twentieth Day of March, 2007

JON W. DUDAS
*Director of the United States Patent and Trademark Office*